United States Patent
Jang

(10) Patent No.: US 9,418,854 B2
(45) Date of Patent: Aug. 16, 2016

(54) SEMICONDUCTOR DEVICE INCLUDING BURIED GATE, MODULE AND SYSTEM, AND METHOD FOR MANUFACTURING

(71) Applicant: SK hynix Inc., Icheon (KR)

(72) Inventor: Tae Su Jang, Gwacheon (KR)

(73) Assignee: SK HYNIX INC., Icheon (KR)

( * ) Notice: Subject to any disclaimer, the term of this patent is extended or adjusted under 35 U.S.C. 154(b) by 76 days.

(21) Appl. No.: 14/539,935

(22) Filed: Nov. 12, 2014

(65) Prior Publication Data
US 2015/0072502 A1     Mar. 12, 2015

Related U.S. Application Data

(62) Division of application No. 13/722,794, filed on Dec. 20, 2012, now abandoned.

(30) Foreign Application Priority Data

Aug. 31, 2012    (KR) ........................ 10-2012-0096603

(51) Int. Cl.
| | |
|---|---|
| *H01L 27/10* | (2006.01) |
| *H01L 21/28* | (2006.01) |
| *H01L 29/66* | (2006.01) |
| *H01L 29/788* | (2006.01) |
| *H01L 27/105* | (2006.01) |
| *G11C 7/06* | (2006.01) |
| *H01L 27/108* | (2006.01) |
| *H01L 21/324* | (2006.01) |
| *H01L 29/423* | (2006.01) |

(52) U.S. Cl.
CPC ............ *H01L 21/28202* (2013.01); *G11C 7/06* (2013.01); *H01L 21/28194* (2013.01); *H01L 21/324* (2013.01); *H01L 27/1052* (2013.01); *H01L 27/10876* (2013.01); *H01L 27/10891* (2013.01); *H01L 29/4236* (2013.01); *H01L 29/66621* (2013.01); *H01L 29/66825* (2013.01); *H01L 29/788* (2013.01)

(58) Field of Classification Search
CPC ....................................................... H01L 27/10
USPC ........................................................ 365/149
See application file for complete search history.

(56) References Cited

U.S. PATENT DOCUMENTS

| | | | | |
|---|---|---|---|---|
| 4,882,649 A | * | 11/1989 | Chen | .................. H01G 4/20 257/296 |
| 6,133,605 A | * | 10/2000 | Kishi | ............. H01L 21/28202 257/324 |

(Continued)

FOREIGN PATENT DOCUMENTS

| | | | |
|---|---|---|---|
| KR | 10-2009-0110170 A | | 10/2009 |
| KR | 10-2010-0092639 A | | 8/2010 |

*Primary Examiner* — Min Huang

(57) ABSTRACT

An embodiment of the semiconductor device includes a recess formed in an active region, a gate buried in a lower part of the recess, a first capping insulation film formed over the gate, a second capping insulation film formed over the first capping insulation film, and a third capping insulation film formed over the second capping insulation film. In the semiconductor device including the buried gate, mechanical stress caused by a nitride film can be reduced by reducing the volume of a nitride film in a capping insulation film formed over a buried gate, and the ratio of silicon to nitrogen of the nitride film is adjusted, so that mechanical stress is reduced, resulting in improvement of operation characteristics of the semiconductor device.

7 Claims, 12 Drawing Sheets

(56) References Cited

U.S. PATENT DOCUMENTS

| | | | |
|---|---|---|---|
| 6,440,807 B1* | 8/2002 | Ajmera | H01L 29/7834 257/E21.132 |
| 6,498,365 B1* | 12/2002 | Wakamiya | H01L 21/31155 257/314 |
| 6,518,617 B1* | 2/2003 | Nakamura | H01L 29/792 257/314 |
| 8,357,574 B2* | 1/2013 | Yeh | H01L 21/28525 257/E21.431 |
| 2006/0246649 A1* | 11/2006 | Seo | H01L 27/11521 438/212 |
| 2007/0218623 A1* | 9/2007 | Chua | C23C 14/10 438/240 |
| 2008/0014688 A1* | 1/2008 | Thean | H01L 21/823807 438/197 |
| 2009/0194809 A1* | 8/2009 | Cho | H01L 21/28282 257/324 |
| 2009/0261420 A1* | 10/2009 | Ryu | H01L 29/66621 257/368 |
| 2010/0283099 A1* | 11/2010 | Ajika | H01L 29/792 257/324 |
| 2011/0037111 A1* | 2/2011 | Kim | H01L 27/10885 257/302 |

\* cited by examiner

SEMICONDUCTOR DEVICE INCLUDING BURIED GATE, MODULE AND SYSTEM, AND METHOD FOR MANUFACTURING

CROSS-REFERENCE TO RELATED APPLICATION

The present application is a divisional of U.S. patent application Ser. No. 13/722,794, filed Dec. 20, 2012, which claims priority of Korean Patent Application No. 10-2012-0096603 filed on 31 Aug. 2012, which are incorporated by reference in their entirety.

BACKGROUND

Embodiments relate to a semiconductor device including a buried gate, and particular embodiments relate to a semiconductor device configured to reduce mechanical stress caused by a nitride film by subtracting the volume of the nitride film from a capping insulation film formed over a buried gate.

Generally, a semiconductor is a material that falls within an intermediate region between a conductor and a nonconductor from among materials affected by electrical conductivity. Although a semiconductor is similar to a nonconductor in a pure state, electrical conductivity of the semiconductor device is increased by impurity implantation or other manipulation. The semiconductor is used to form a semiconductor device such as a transistor through impurity implantation and conductor connection. A device that has various functions while being formed of a semiconductor element is referred to as a semiconductor device. A representative example of the semiconductor device is a semiconductor memory device.

A semiconductor memory device includes a plurality of transistors. The transistor has three regions, i.e., a gate, a source, and a drain. Electric charges are moved between the source and the drain according to a control signal (the magnitude of a voltage) input to the gate of the transistor. The charges between the source and the drain move through a channel region in accordance with the properties and operation of the semiconductor device.

Generally, a method for manufacturing the transistor includes forming a gate over a semiconductor substrate, and forming a source and drain by doping impurities over the semiconductor substrate located at both sides of the gate. A region between the source and the drain may be located below a gate, and is used as a channel region of the transistor. The transistor including a horizontal channel region has difficult to form a highly-integrated semiconductor device.

In order to solve the above-mentioned problem, there is proposed a three-dimensional (3D) transistor in which all or some parts of the gate are buried by etching a silicon substrate. In particular, a buried gate structure in which the gate is completely buried in the silicon substrate, has been used.

Generally, the buried gate structure uses a nitride film as a capping insulation film formed over the gate so as to implement gate isolation. However, when using the nitride film formed over the gate, cell-transistor characteristics (specifically, refresh characteristics) may be deteriorated due to mechanical stress caused by the nitride film.

BRIEF SUMMARY

Various embodiments are directed to providing a semiconductor device including a buried gate, a module, and a system each including the same, and a method for manufacturing the semiconductor device, that substantially obviate one or more problems due to limitations and disadvantages of the related art.

An embodiment of the present invention relates to a semiconductor device including a buried gate structure, which is configured to improve refresh characteristics by reducing mechanical stress caused by a capping insulation film.

In accordance with an embodiment, a semiconductor device includes: a recess formed in an active region; a gate buried in a lower part of the recess; a first capping insulation film formed over the gate; a second capping insulation film formed over the first capping insulation film; and a third capping insulation film formed over the second capping insulation film so as to fill the recess.

The first capping insulation film may be formed of a silicon nitride film having a higher nitrogen ratio than a $Si_3N_4$ material.

The first capping insulation film may be formed at a sidewall of the recess and over the gate.

The second capping insulation film may include an oxide film in which the first capping insulation film is partially oxidized.

The third capping insulation film may be formed of a silicon nitride film having a higher nitrogen ratio than a $Si_3N_4$ material. The third capping insulation film may include an oxide film. The third capping insulation film may include at least one of a low temperature oxide film and a Plasma Enhanced TEOS (PE-TEOS) oxide film.

The recess may include a fin structure in which the active region is more protruded than a device isolation film.

In accordance with another aspect of the present invention, a method for forming a semiconductor device includes: forming a device isolation film defining an active region; forming a recess located in the active region; forming a gate at a lower part of the recess; forming a first capping insulation film over the gate; forming a second capping insulation film over the first capping insulation film; and forming a third capping insulation film over the second capping insulation film so as to fill the recess.

The method may further include: performing $H_2$ annealing after formation of the recess.

The forming the first capping insulation film may include depositing a first nitride film at a sidewall of the recess and over the gate.

The forming the first capping insulation film may include implanting nitrogen ions into the first nitride film.

The implanting the nitrogen ions may include implanting the nitrogen ions under a process condition of a dose of between about $1E13/cm^2$ to $1E16/cm^2$ and an energy of between about 1 KeV to 50 KeV.

The forming the first capping insulation film may include forming a silicon nitride film having a higher nitrogen ratio than a $Si_3N_4$ material.

The forming the second capping insulation film may include converting the first capping insulation film having a predetermined thickness into an oxide film by partially oxidizing the first capping insulation film.

The forming the second capping insulation film may include partially oxidizing the first capping insulation film by performing an oxidation process on the first capping insulation film. The oxidation process includes a radical oxidation process.

The radical oxidation process may be performed for a predetermined time of between about 10 s~1000 s at a temperature of between about 500° C.~1000° C.

The radical oxidation process may be performed in such a manner that nitrogen of about 5%~95% contained in the capping insulation film is oxidized.

The forming the third capping insulation film may include forming a second nitride film over the second capping insulation film so as to fill the recess.

The forming the third capping insulation film may further include implanting nitrogen ions in the second nitride film.

The forming the third capping insulation film may include forming an oxide film over the second capping insulation film so as to fill the recess.

It is to be understood that both the foregoing general description and the following detailed description of the present invention are exemplary and explanatory and are intended to provide further explanation of the invention as claimed.

DESCRIPTION

Reference will now be made in detail to embodiments, examples of which are illustrated in the accompanying drawings. Wherever possible, the same reference numbers will be used throughout the drawings to refer to the same or like parts.

Figure 1:
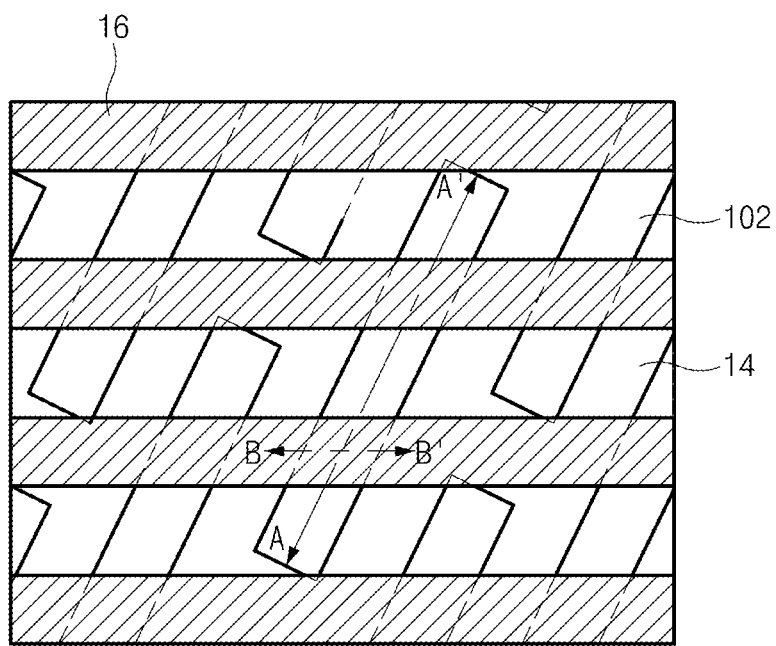
FIG. 1 is a plan view illustrating a $6F^2$ structure to which a semiconductor device of the embodiment is applied.
Figure 2:
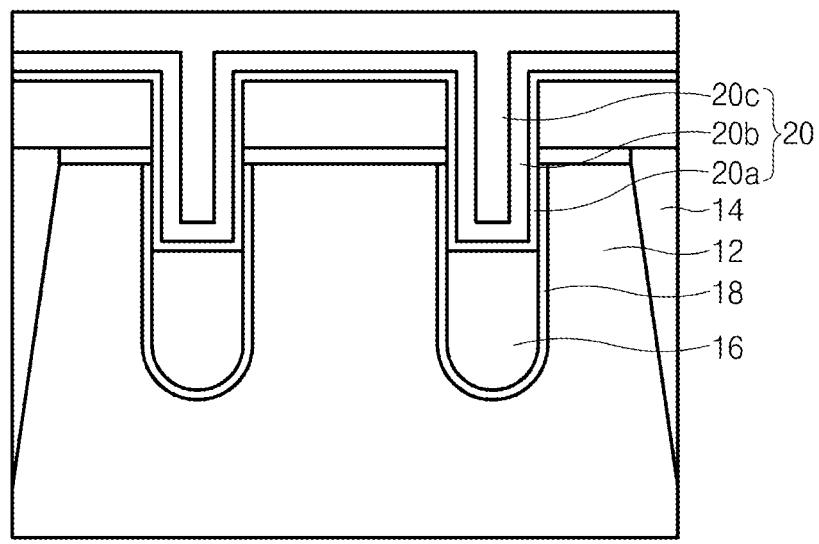
FIG. 2 is a cross-sectional view illustrating a semiconductor device taken along the line A-A' of FIG. 1.

FIG. 1 is a plan view illustrating a $6F^2$ structure to which a semiconductor device of an embodiment is applied. FIG. 2 is a cross-sectional view illustrating a semiconductor device taken along the line A-A' of FIG. 1.

Referring to FIGS. 1 and 2, a device isolation film 14 defining an active region 12 is formed over a predetermined region of a semiconductor substrate, and a gate 16 has a buried gate that is buried in the active region 12 and the device isolation film. The gate 16 may be formed of titanium (Ti), titanium nitride (TiN), tungsten (W), or tungsten nitride (WN).

The active region 12 is formed to obliquely cross the gate 16. A gate insulation film (oxide film) 18 is formed between the gate 16 and the active region 12. The gate insulation film 18 may be formed of a silicon oxide film ($SiO_2$) and/or a high-K material having a higher dielectric constant (higher permittivity) than a $SiO_2$ film.

Specifically, according to an embodiment, a capping insulation film 20 for isolating the gate 16 may be formed of a nitride film only, and may also be formed of a laminate structure of a nitride film and an oxide film. The capping insulation film 20 includes a nitride film 20a, an oxide film 20b, and a nitride film 20c. The oxide film 20b may be formed by oxidizing some parts of the nitride film 20a through an oxidation process. The oxidation process includes a radical oxidation process.

The capping insulation film may be formed of a laminate structure of the nitride film and the oxide film, so that the volume of the nitride film is reduced. This results in a reduction of mechanical stress caused by the nitride film.

Nitrogen ions may be implanted into the nitride films (20a, 20c), and the composition ratio of silicon (Si) and nitrogen (N) is adjusted so that mechanical stress caused by the nitride films (20a, 20c) can be further reduced. For example, the nitride film 20a or 20c may be formed of a silicon nitride film that has a higher ratio of silicon (Si) to nitrogen (N) as compared to a $Si_3N_4$ material.

The nitride film 20c according to an embodiment may be replaced with an oxide film.

FIGS. 3A to 3F are cross-sectional views illustrating a method for sequentially forming the semiconductor device of FIG. 2.

Figure 3A:
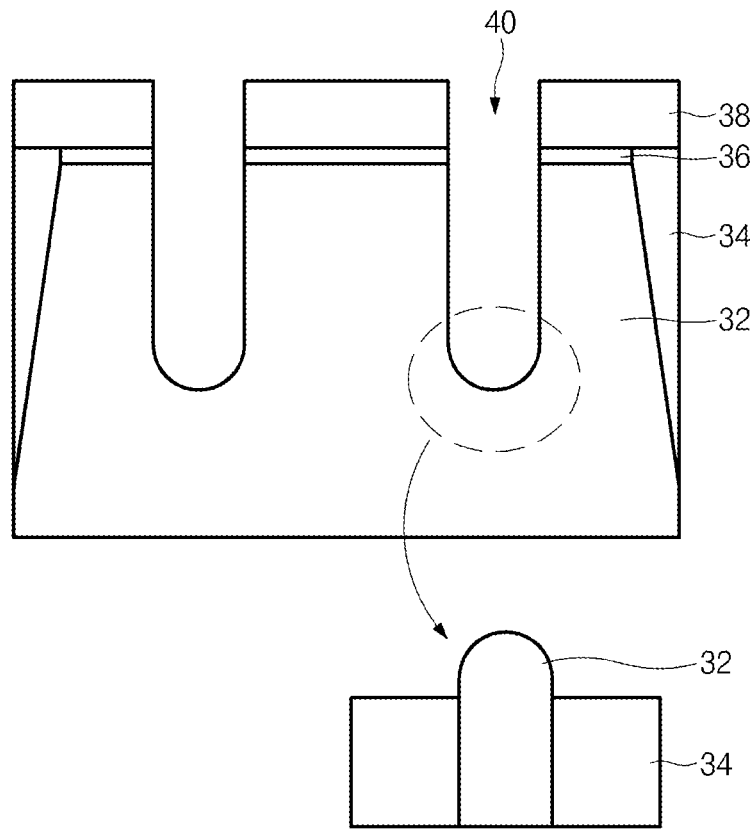
FIGS. 3A to 3F are cross-sectional views illustrating a method for sequentially forming the semiconductor device of FIG. 2.

Referring to FIG. 3A, a pad oxide film (not shown) and a pad nitride film (not shown) are formed over the semiconductor substrate. Subsequently, after a photoresist film (not shown) is formed over the pad nitride film, a photoresist pattern (not shown) defining an active region is formed over the pad nitride film through a photolithographic process using a Shallow Trench Isolation (STI) method.

The pad nitride film and the pad oxide film are sequentially etched using the photoresist pattern as an etch mask, resulting in formation of a mask pattern (not shown). Thereafter, a device-isolation trench defining an active region 32 is formed by etching the semiconductor substrate using the mask pattern as the etch mask.

Subsequently, a sidewall insulation film (not shown) is formed at an inner surface of the device-isolation trench. After an insulation film is formed to fill the device-isolation trench, the insulation film is planarized (for example CMP-processed) to expose an oxide film pattern 36, resulting in formation of a device isolation film 34 defining the active region 32.

The device isolation film 34 may include a Boro-phospho Silicate Glass (BPSG) film, a Phosphorous Silicate Glass (PSG) film, a Spin On Glass (SOG) film, a Polysilazane (PSZ) film, an O3-TEOS (Tetrahydroxysilane) film, a High Density Plasma (HDP) oxide film, and/or an Atomic Layer Deposition (ALD) film.

Subsequently, after a hard mask layer (not shown) is formed over the active region 32 and the device isolation film 34, a photoresist pattern (not shown) defining a gate region is formed over the hard mask layer. The hard mask pattern 38 is formed by etching the hard mask layer using the photoresist pattern as an etch mask.

The active region 32 and the device isolation film 34 are etched to a predetermined depth using the hard mask pattern 38 as an etch mask, such that a gate recess 40 defining the gate region is formed.

The device isolation film 34 may be etched more deeply than the active region 32 using the etch selectivity ratio of the active region 32 and the device isolation film 34 This results in formation of a fin structure in which the active region 32 is more protruded than the device isolation film 34 in the gate recess 40. The drawing in the lower portion of FIG. 3A is provided for showing the fin structure and depicts a cross section along B-B' shown in FIG. 1.

Subsequently, a $H_2$ annealing process is performed on the etched active region, so that the damaged substrate generated in the etching process of the gate recess 40 can be recovered.

Figure 3B:
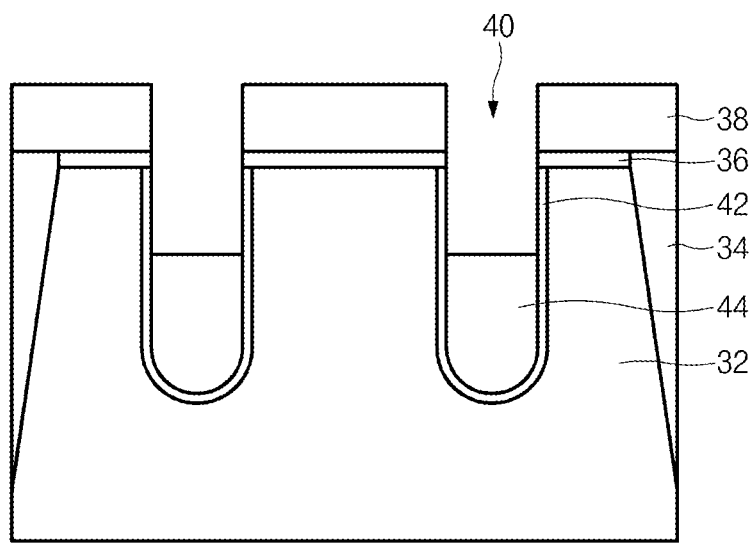

Referring to FIG. 3B, a gate insulation film 42 is formed at an inner surface of the gate recess 40.

A method for forming the gate insulation film 42 is as follows. After the silicon oxide ($SiO_2$) film is formed at an inner surface of the gate recess 40 through an oxidation process (e.g. a radical oxidation process), the silicon oxide ($SiO_2$) film is selectively etched, resulting in formation of the gate insulation film 42. Alternatively, a high dielectric (high-K) material having a higher dielectric constant (higher permittivity) than the silicon oxide ($SiO_2$) film is deposited over an inner surface of the gate recess 40 through Atomic Layer Deposition (ALD) or Chemical Vapor Deposition (CVD), resulting in formation of the gate insulation film 42.

A conductive film (not shown) for a gate is formed over the gate insulation film 42 such that the gate recess 40 is filled with the conductive film. Subsequently, the conductive film for the gate (hereinafter referred to as a gate conductive film) is etched and planarized to expose the hard mask pattern 38. The conductive film for the gate may be formed of titanium (Ti), titanium nitride (TiN), tungsten (W), or tungsten nitride (WN), or a combination thereof. The doped polysilicon may be used as the gate conductive film.

Subsequently, the gate conductive film is selectively etched in a manner that the gate conductive film of a predetermined height remains only at a lower part of the gate recess 40, resulting in formation of the gate 44. The gate conductive film may be selectively removed through an etchback process.

Figure 3C:
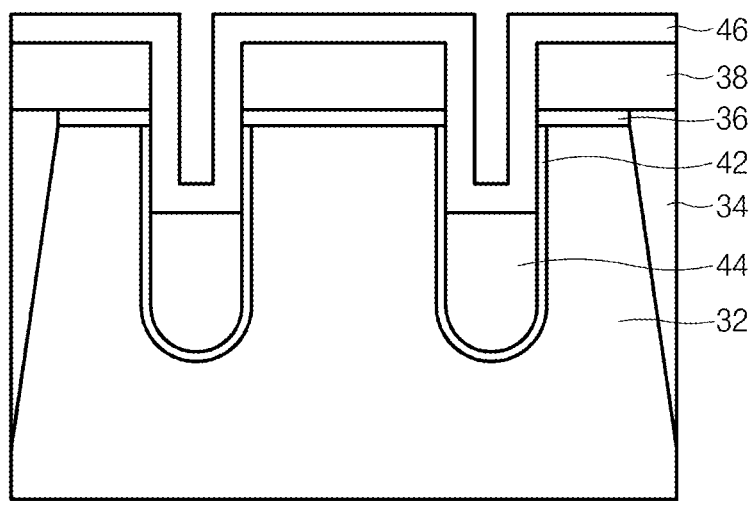

Referring to FIG. 3C, a capping insulation film 46 is formed not only at an upper part of the gate 44 but also at a sidewall of the gate recess 40. The capping insulation film 46 may include a $Si_3N_4$ film, and may have a thickness of about 10Å~200Å.

Chemical Vapor Deposition (CVD) may be used as a method for forming the capping insulation film 46. The CVD may include Atmospheric Pressure CVD (APCVD), Low Pressure CVD (LPCVD), Plasma Enhanced CVD (PECVD), Metal Organic CVD (MOCVD), and/or Thermal CVD.

Figure 3D:
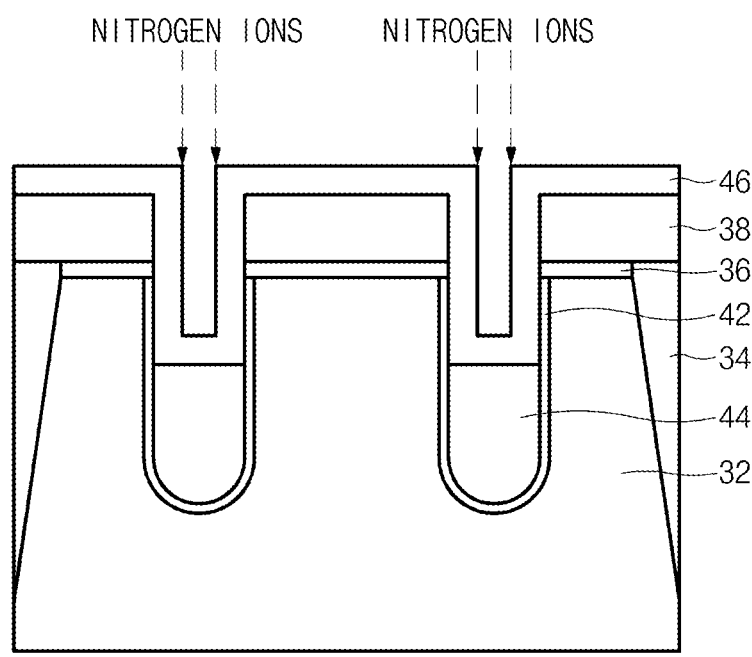

Referring to FIG. 3D, nitrogen ions are implanted into the capping insulation film 46.

The nitrogen ions may be implanted under a process condition of a dose of between about $1E13/cm^2$ to $1E16/cm^2$ and energy of between about 1 KeV to 50 KeV, and may also be implanted at an angle of 0° or a predetermined slope.

Nitrogen implanted into the capping insulation film 46 reduces mechanical stress caused by the capping insulation film 46 by adjusting the ratio of silicon to nitrogen of the insulation film 46. The capping insulation film 46 may be formed of a silicon nitride film having a higher ratio of silicon to nitrogen than the $Si_3N_4$ film.

Figure 3E:
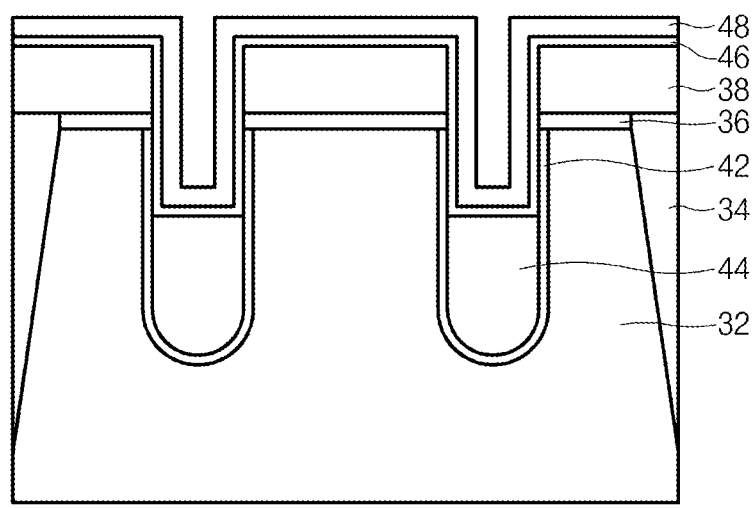

Referring to FIG. 3E, an oxidation process (e.g. a radical oxidation process) is performed on the capping insulation film 46 in such a manner that the capping insulation film 46 is partially oxidized, resulting in formation of a capping oxide film 48. That is, the capping insulation film 46 having a predetermined thickness is converted into an oxide film to form the capping oxide film 48.The radical oxidation process may be carried out for a predetermined time of between about 10 s~1000 s at a temperature of between about 500° C.~1000° C. with nitrogen of between about 5%~95% contained in the capping insulation film 46 being oxidized.

As described above, the capping insulation film 46 is not completely oxidized during the radical oxidation process in order to prevent the gate 44 from being oxidized while the radical oxidation process is performed by the capping insulation film 46, as well as to prevent the gate 44 from being oxidized in a subsequent process.

Figure 3F:
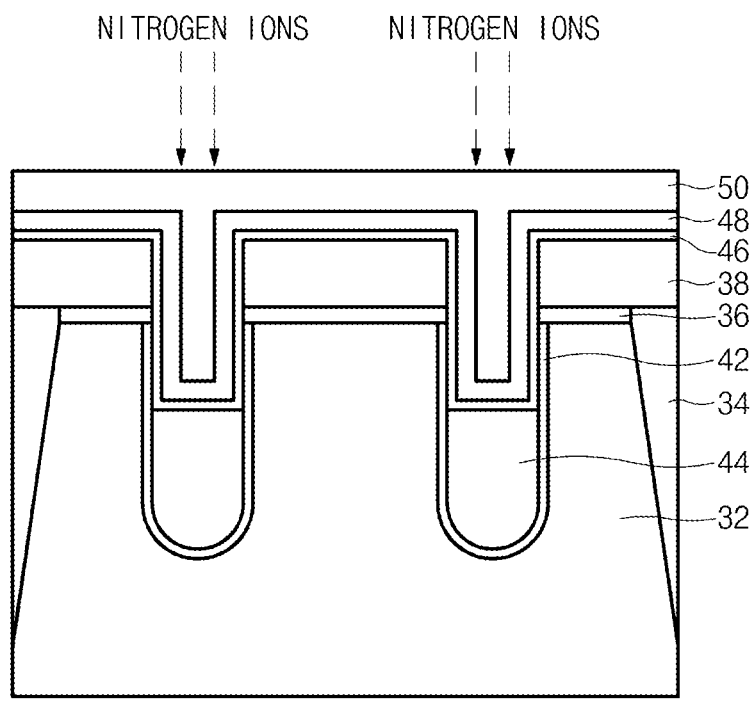

Referring to FIG. 3F, the capping nitride film 50 is formed over the capping oxide film 48 in such a manner that the gate recess 40 is filled with the capping nitride film 50.

Subsequently, nitrogen ions are implanted into the capping nitride film 50 as shown in FIG. 3D, and the ratio of silicon to nitrogen of the capping nitride film 50 is adjusted, so that mechanical stress caused by the capping nitride film 50 can be reduced. The ion implantation condition can be that of FIG. 3D.

Alternatively, the oxide film instead of the capping nitride film 50, may be formed as shown in FIG. 3F. The oxide film may include one or both of a low temperature oxide film and a Plasma Enhanced TEOS (PE-TEOS) oxide film.

A method for forming a bit line (not shown) and a capacitor (not shown) in a subsequent process may be a method for forming a bit line and a capacitor in the conventional $6F^2$ structure having a buried gate. As such, a detailed description thereof will herein be omitted for convenience of description.

Figure 4:
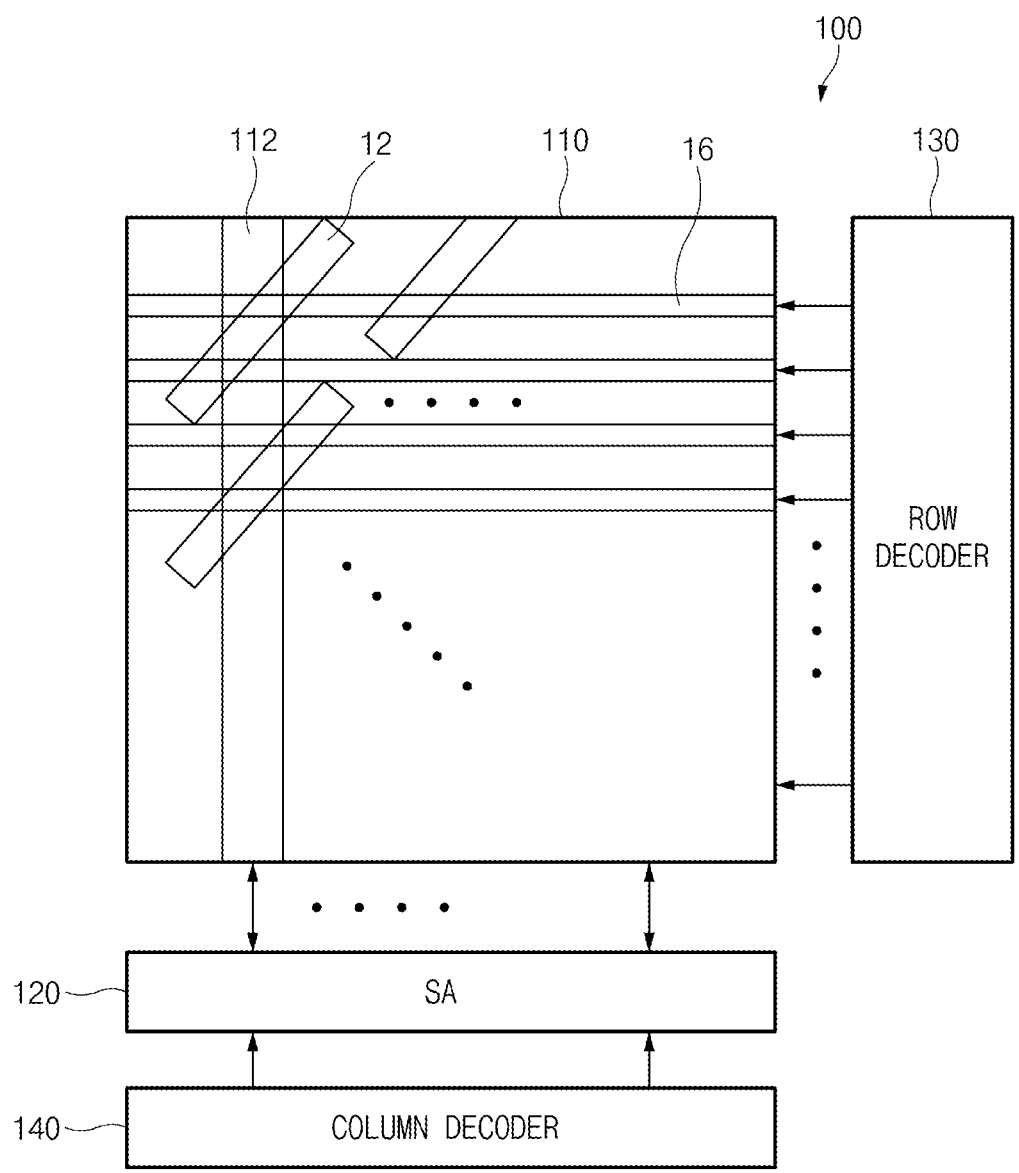
FIG. 4 is a circuit diagram illustrating the semiconductor device extended even to a peripheral region.

FIG. 4 is a circuit diagram illustrating the semiconductor device extended to a peripheral region. In FIG. 4, for convenience of description and better understanding of the present invention, the same reference numerals as those of FIGS. 1 and 2 represent the same elements.

Referring to FIG. 4, the semiconductor device 100 includes a cell array 110, a sense amplifier (SA) 120, a column decoder 140, and a row decoder 130.

The cell array 110 includes a plurality of memory cells (not shown), that are coupled to a word line (buried gate) 16 and the bit line 112. The gate 16 is buried in an active region of the memory cell. Specifically, the capping insulation film for capping the buried gate 16 so as to isolate the buried gate 16 in the memory cell, includes a first capping nitride film, a capping oxide film, and a second capping nitride film. In the case of the first capping nitride film, nitrogen is implanted into the first capping nitride film so that the ratio of silicon to nitrogen is adjusted. The capping oxide film is formed by partially oxidizing the first nitride film. In the case of the second capping nitride film formed over the capping oxide film, nitrogen is implanted into the second capping nitride film so that the ratio of silicon to nitrogen is adjusted.

The sense amplifier 120 is coupled to the bit line 112 so that it can sense and amplify data stored in the memory cell of the cell array 110.

The row decoder 130 is coupled to the word line (buried gate) 16, generates a signal for selectively turning on or off memory cells of the cell array 110, and outputs the signal to a specific word line (buried gate) 16.

The column decoder 140 generates a drive signal for operating the sense amplifier 120 coupled to the cell selected by the row decoder 130, and outputs the drive signal to the sense amplifier 120.

The semiconductor device shown in FIG. 4 can be applied to computing memories (for example, DRAM, SRAM, DDR3 SDRAM, DDR2 SDRAM, DDR SDRAM, etc.), consumer memories (for example, DDR3 SDRAM, DDR2 SDRAM, DDR SDRAM, SDR SDRAM, etc.), graphics memories (for example, DDR3 SDRAM, GDDR3 SDMRA, GDDR4 SDRAM, GDDR5 SDRAM, etc.), mobile memories, and the like.

Figure 5:
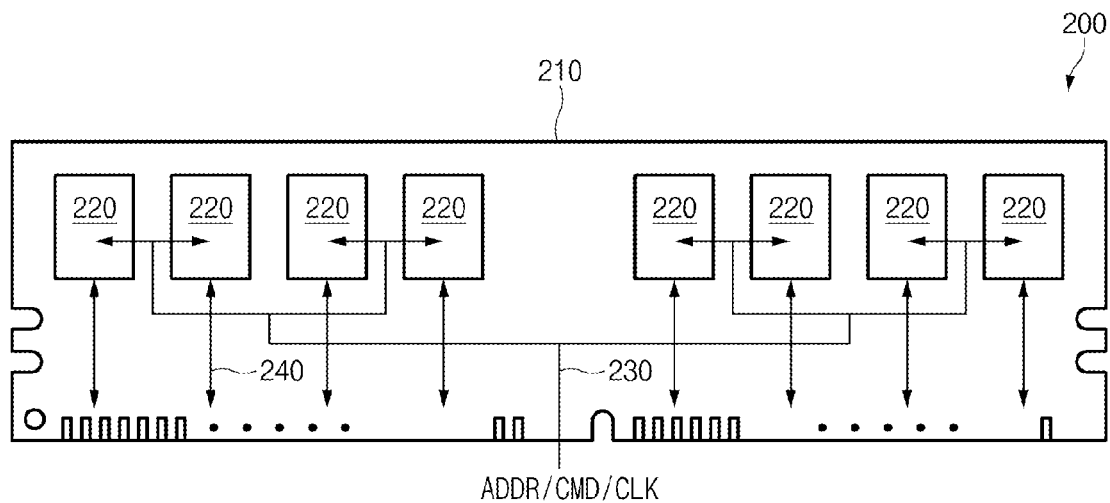
FIG. 5 is a circuit diagram illustrating a semiconductor module according to one embodiment.

FIG. 5 is a circuit diagram illustrating a semiconductor module according to one embodiment of the present invention.

Referring to FIG. 5, the semiconductor module 200 includes a plurality of semiconductor elements 220 mounted to a module substrate 210, a command link 230 for allowing each semiconductor element 220 to receive control signals (for example, an address signal (ADDR), a command signal (CMD), and a clock signal (CLK)) from an external controller (not shown), and a data link 240 coupled to the semiconductor element 220 so as to transmit input/output (I/O) data.

In this case, the semiconductor elements 220 may be exemplarily implemented as the semiconductor device 100 shown in FIG. 4. That is, the semiconductor device 220 includes the gate buried in the active region. The capping insulation film formed over the buried gate so as to isolate the buried gate includes a first capping nitride film, a capping oxide film, and a second capping nitride film. In the case of the first capping nitride film, nitrogen is implanted into the first capping nitride film so that the ratio of silicon to nitrogen is adjusted. The capping oxide film is formed by partially oxidizing the first nitride film. In the case of the second capping nitride film formed over the capping oxide film, nitrogen is implanted into the second capping nitride film so that the ratio of silicon to nitrogen is adjusted.

The command link 230 and the data link 240 may be formed similar to those of general semiconductor modules.

Although eight semiconductor elements 220 are mounted to the front surface of the module substrate 210 as shown in FIG. 5, it should be noted that the semiconductor elements 220 can also be mounted to the back surface of the module substrate 210. That is, the semiconductor elements 220 may be mounted to one side or both sides of the module substrate 210, and the number of mounted semiconductor elements 220 is not limited to the example of FIG. 5. In addition, a material and structure of the module substrate 210 are not specially limited.

Figure 6:
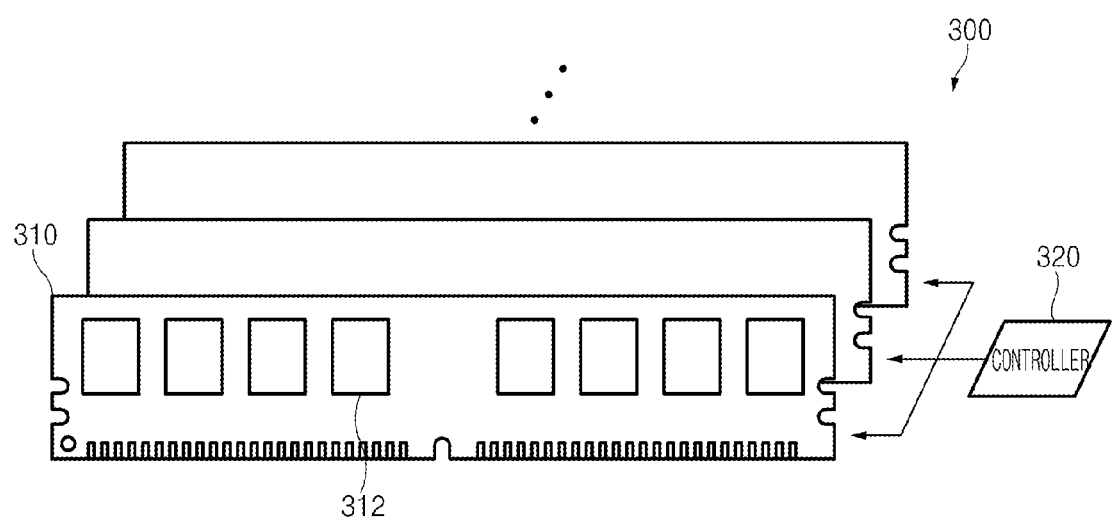
FIG. 6 is a circuit diagram illustrating a semiconductor system according to an embodiment.

FIG. 6 shows a semiconductor system according to one embodiment.

Referring to FIG. 6, a semiconductor system 300 includes at least one semiconductor module 310 including a plurality of semiconductor elements 312, and a controller 320 for providing a bidirectional interface between each semiconductor module 310 and an external system (not shown) so as to control the operations of the semiconductor module 310.

The controller 320 may be similar in function to a controller for controlling a plurality of semiconductor modules for use in a general data processing system, and as such a detailed description thereof will be omitted herein for convenience of description.

In this case, the semiconductor module 310 may be, for example, a semiconductor module 200 shown in FIG. 5.

Figure 7:
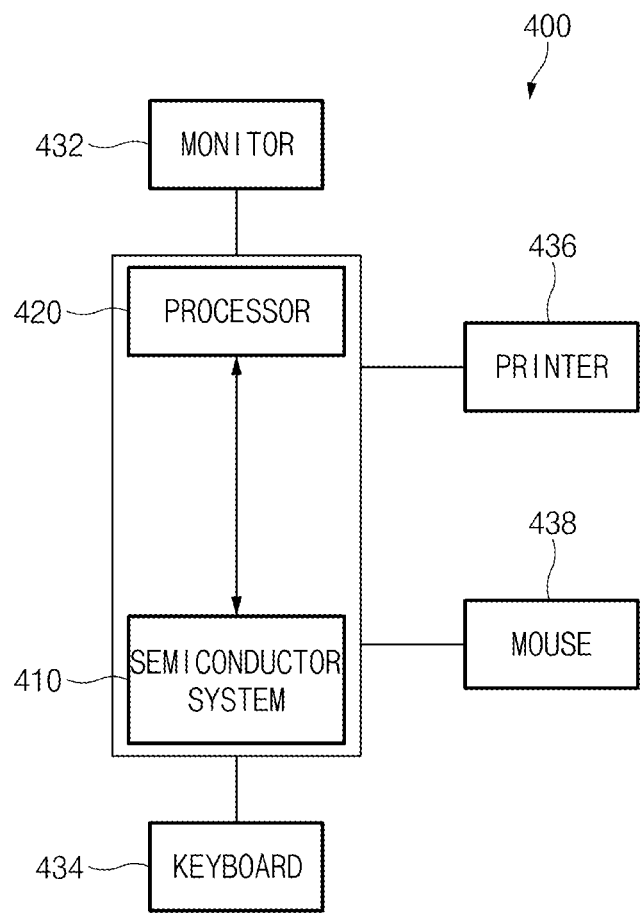
FIG. 7 is a block diagram illustrating a computer system according to an embodiment.

FIG. 7 shows a computer system according to one embodiment.

Referring to FIG. 7, the computer system 400 includes a semiconductor system 410 and a processor 420 such as a Central Processing Unit (CPU).

The semiconductor system 410 may store data requisite for controlling the operations of the computer system 400. The semiconductor system 410 may exemplarily be used as the semiconductor system 300 shown in FIG. 6. The semiconductor system 410 includes at least one semiconductor module. The semiconductor device in the semiconductor module includes the gate buried in the active region. The capping insulation film formed over the buried gate so as to isolate the buried gate, includes a first capping nitride film, a capping oxide film, and a second capping nitride film. In the case of the first capping nitride film, nitrogen is implanted into the first capping nitride film so that the ratio of silicon to nitrogen is adjusted. The capping oxide film is formed by partially oxidizing the first nitride film. In the case of the second capping nitride film formed over the capping oxide film, nitrogen is implanted into the second capping nitride film so that the ratio of silicon to nitrogen is adjusted.

The processor 420 controls the operations of the computer system 400 by processing data stored in the semiconductor system 410. The processor 420 may be similar in function to the CPU used in a general computer system.

The computer system 400 may include a variety of user interface devices, for example, a monitor 432, a keyboard 434, a printer 436, a mouse 438, etc.

Figure 8:
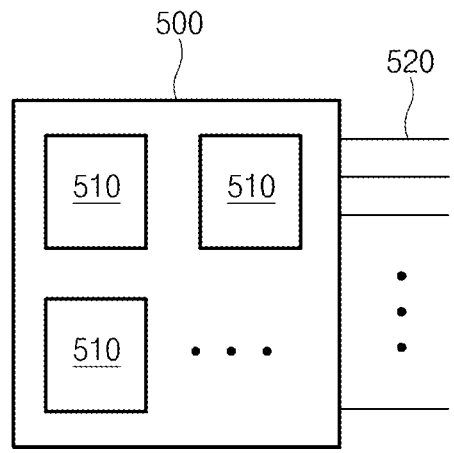
FIG. 8 is a diagram illustrating a data processing system according to an embodiment.

FIG. 8 shows a data processing system according to one embodiment.

Referring to FIG. 8, the data processing system 500 is included in an electronic system (not shown), such that it performs a specific function from among several functions of the electronic system.

The data processing system 500 may include at least one semiconductor device 510 mounted to the substrate.

The semiconductor device 510 includes a cell array (not shown) for storing data needed for performing a specific function of the electronic system, and a processor (not shown) for performing the corresponding function by processing the data stored in the cell array. That is, the semiconductor element device 510 includes a unit for storing data in one unit element (die or chip) and a unit for performing a specific function of the electronic system by processing the stored data. The cell array includes a plurality of memory cells coupled to a bit line and a word line. The gate of a memory cell is buried in the active region. The capping insulation film formed over the buried gate so as to isolate the buried gate includes a first capping nitride film, a capping oxide film, and a second capping nitride film. In the case of the first capping nitride film, nitrogen is implanted into the first capping nitride film so that the ratio of silicon to nitrogen is adjusted. The capping oxide film is formed by partially oxidizing the first nitride film. In the case of the second capping nitride film formed over the capping oxide film, nitrogen is implanted into the second capping nitride film so that the ratio of silicon to nitrogen is adjusted.

The data processing system 500 is coupled to other constituent elements (for example, CPUs) of the electronic system through leads 520, such that it can unidirectionally or bidirectionally transmit and receive data and control signals.

Figure 9:
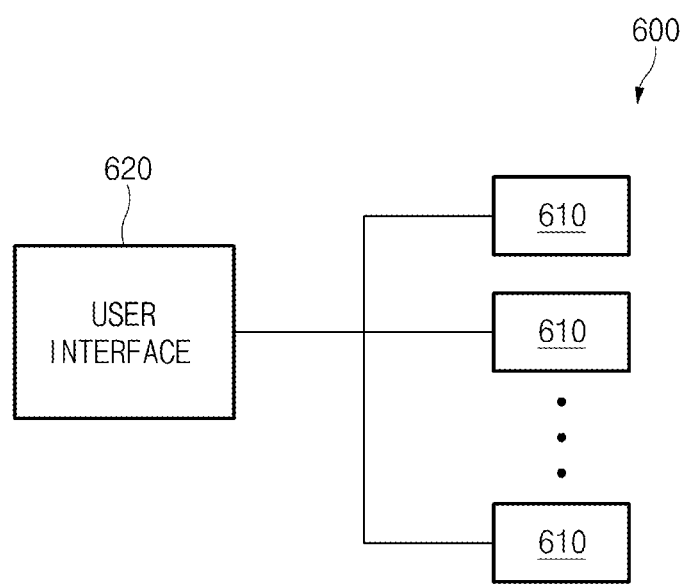
FIG. 9 is a block diagram illustrating an electronic system according to an embodiment.

FIG. 9 shows an electronic system according to one embodiment.

Referring to FIG. 9, the electronic system 600 includes at least one data processing system 610 and a user interface 620.

The data processing system 610 performs a specific function from among several functions of the electronic system 600, and includes at least one semiconductor device mounted to the substrate. The semiconductor device may include a cell array (not shown) for storing data needed for performing a specific function of the electronic system 600 and a processor (not shown) for controlling the corresponding function by processing the data stored in the cell array. In this case, the cell array includes a plurality of memory cells coupled to a bit line and a word line. The gate of a memory cell is buried in the active region. The capping insulation film formed over the buried gate so as to isolate the buried gate includes a first capping nitride film, a capping oxide film, and a second capping nitride film. In the case of the first capping nitride film, nitrogen ion is implanted into the first capping nitride film so that the ratio of silicon to nitrogen is adjusted. The capping oxide film is formed by partially oxidizing the first nitride film. In the case of the second capping nitride film formed over the capping oxide film, nitrogen is implanted into the second capping nitride film so that the ratio of silicon to nitrogen is adjusted.

The user interface 620 provides an interface between the user and the data processing system 610. The user interface

620 may include a keypad, a touchscreen, a speaker, etc. incorporated into the electronic device.

The electronic system 600 includes a variety of embedded systems included in various electronic, information, and communication devices, for example, computers, household appliances, factory automation systems, elevators, mobile phones, etc.

As is apparent from the above description, the semiconductor device according to embodiments reduces mechanical stress caused by a nitride film by reducing the volume of the nitride film formed over a gate in a buried gate structure, such that semiconductor device characteristics (specifically, refresh characteristics) can be improved.

In addition, the semiconductor devices according to embodiments reduce the ratio of silicon (Si) to nitrogen (N) of the nitride film formed over the buried gate. Mechanical stress caused by the nitride film is mitigated such that semiconductor device characteristics (specifically, refresh characteristics) can be improved.

Although the above-mentioned embodiments have exemplarily disclosed the $6F^2$ structure in which the active region is formed to obliquely cross the word line (gate), embodiments are not limited thereto and can also be applied to other structures. That is, the semiconductor device according to embodiments can be applied to structures to which a buried gate formed when the gate is buried in the active region is applied.

Those skilled in the art will appreciate that the present invention may be carried out in other specific ways than those set forth herein without departing from the spirit and essential characteristics of various embodiments. The above exemplary embodiments are therefore to be construed in all aspects as illustrative and not restrictive. Embodiments should be determined by the appended claims and their legal equivalents, not by the above description, and all changes coming within the meaning and equivalency range of the appended claims are intended to be embraced therein. Also, claims that are not explicitly cited in each other in the appended claims may be presented in combination as an exemplary embodiment or included as a new claim by a subsequent amendment after the application is filed.

The above embodiments are illustrative and not limitative. Various alternatives and equivalents are possible. Embodiments are not limited by the type of deposition, etching polishing, and patterning steps described herein. Nor are embodiments limited to any specific type of semiconductor device. For example, embodiments may be implemented in a dynamic random access memory (DRAM) device or non volatile memory device. Other additions, subtractions, or modifications are possible in view of the present disclosure and are intended to fall within the scope of the appended claims.

What is claimed is:

1. A method for forming a semiconductor device comprising:
    forming a device isolation film defining an active region;
    forming a recess located in the active region;
    forming a gate at a lower part of the recess;
    forming a first nitride film over the gate;
    implanting nitrogen ions into the first nitride film to convert the first nitride film into a first nitrogen-rich nitride film;
    performing an oxidation process on the first nitrogen-rich nitride film to convert a top portion of the first nitrogen-rich nitride film into an oxide film;
    forming a second nitride film over the oxide film; and
    implanting nitrogen ions into the second nitride film to convert the second nitride film into a second nitrogen-rich nitride film.

2. The method according to claim 1, further comprising:
    performing $H_2$ annealing after forming the recess.

3. The method according to claim 1, wherein forming the first nitride film includes:
    depositing a nitride film at a sidewall of the recess and over the gate.

4. The method according to claim 1, wherein the implanting comprises:
    implanting the nitrogen ions under a process condition of a dose of between about $1E13/cm^2$ to $1E16/cm^2$ and an energy of between about 1 KeV to 50 KeV.

5. The method according to claim 1, wherein forming the first nitrogen-rich nitride film comprises:
    converting the first nitride film into a silicon nitride film having a higher nitrogen ratio than a $Si_3N_4$ material.

6. The method according to claim 1, wherein the oxidation process is performed for a predetermined time of between about 10 s~1000 s at a temperature of between about 500° C.~1000° C.

7. The method according to claim 1, wherein the oxidation process is performed such that nitrogen of between about 5%~95% in the first nitrogen-rich nitride film is oxidized.

* * * * *